United States Patent
Chen

(10) Patent No.: US 8,912,825 B2
(45) Date of Patent: Dec. 16, 2014

(54) SENSE AMPLIFIER SYSTEM AND SENSING METHOD THEREOF

(71) Applicant: Macronix International Co., Ltd., Hsin-chu (TW)

(72) Inventor: Chung-Kuang Chen, Hsin-chu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 13/856,074

(22) Filed: Apr. 3, 2013

(65) Prior Publication Data

US 2014/0232461 A1  Aug. 21, 2014

Related U.S. Application Data

(60) Provisional application No. 61/765,814, filed on Feb. 18, 2013.

(51) Int. Cl.
*G11C 7/00* (2006.01)
*G11C 7/06* (2006.01)

(52) U.S. Cl.
CPC .................................. *G11C 7/06* (2013.01)
USPC .............. 327/52; 330/261; 330/285; 330/296

(58) Field of Classification Search
USPC .............................. 327/52; 330/261, 285, 296
See application file for complete search history.

(56) References Cited

U.S. PATENT DOCUMENTS

| | | | | |
|---|---|---|---|---|
| 6,037,808 A * | 3/2000 | Houston et al. | ................. | 327/55 |
| 6,261,879 B1 * | 7/2001 | Houston et al. | ............... | 438/154 |
| 6,373,281 B1 * | 4/2002 | Chuang et al. | ................... | 326/58 |
| 6,445,216 B1 * | 9/2002 | Bruneau et al. | ................. | 327/52 |
| 7,449,922 B1 * | 11/2008 | Ricavy | ............................ | 327/57 |
| 7,486,544 B2 * | 2/2009 | Mori et al. | ..................... | 365/156 |
| 7,701,245 B1 * | 4/2010 | Vasudevan | ..................... | 326/33 |
| 8,542,551 B2 * | 9/2013 | Kowalczyk | ................... | 365/226 |
| 2006/0023537 A1 * | 2/2006 | Lee et al. | ...................... | 365/206 |
| 2012/0092072 A1 * | 4/2012 | Upputuri et al. | .............. | 330/277 |

* cited by examiner

*Primary Examiner* — Ryan Jager
(74) *Attorney, Agent, or Firm* — Volpe and Koenig, P.C.

(57) ABSTRACT

A sense amplifier system and sensing method thereof are provided. The proposed sense amplifier system includes plural sense amplifiers, each of which includes a first switch having a first terminal, a second terminal, and a bulk terminal electrically connected to the first terminal, a second switch having a first terminal electrically connected to the second terminal of the first switch, a second terminal, and a bulk terminal, a third switch having a first terminal electrically connected to the first terminal of the second switch, a second terminal, and a bulk terminal electrically connected to the bulk terminal of the second switch, and a fourth switch having a first terminal electrically connected to the bulk terminal of the first switch and a second terminal electrically connected to the bulk terminal of the third switch.

17 Claims, 6 Drawing Sheets

Fig. 1 (Related Work)

Fig.2 (Related Work)

SENSE AMPLIFIER SYSTEM AND SENSING METHOD THEREOF

FIELD OF THE INVENTION

The present invention relates to a sense amplifier system and a sensing method thereof. In particular, the sense amplifier system relates to a sense amplifier system having plural sense amplifiers.

BACKGROUND OF THE INVENTION

Memory with more than 1K sense amplifiers and only 1 reference voltage to compare the sensing data would result in relatively higher noise. Noise coupled to the input signal and the reference signal is much different when memory has more sense amplifiers.

There are more than 1K noise coupling path to the reference node and only 1 noise coupling path to the data sensing node so that the parasitic capacitances formed between the control terminal and the bulk terminal of the left-hand side input switch and the a first parasitic capacitance formed between the control terminal and that formed between the control terminal and the bulk terminal of the right-hand side input switch are unbalanced so as to cause a much higher noise level.

The aforementioned noise also damages the read stability and decreases the sensing window of a sense amplifier system.

Keeping the drawbacks of the prior arts in mind, and employing experiments and research full-heartily and persistently, the applicant finally conceived a sense amplifier system and a sensing method thereof.

SUMMARY OF THE INVENTION

It is a primary objective of the present invention to provide a sense amplifier system including plural sense amplifiers, each of which receives an input signal generated from a memory cell and inputted from a bitline, and the same reference voltage value, and includes an extra switch floating the well of the input switches during the setting up process of the input signals to decrease the noises coupled to the input switches.

According to the first aspect of the present invention, a sense amplifier system comprises a sense amplifier including a first switch having a first terminal receiving a power voltage, a second terminal, and a bulk terminal electrically connected to the first terminal, a second switch having a first terminal electrically connected to the second terminal of the first switch, and a bulk terminal, a third switch having a first terminal electrically connected to the first terminal of the second switch, and a bulk terminal electrically connected to the bulk terminal of the second switch, and a fourth switch having a first terminal electrically connected to the bulk terminal of the first switch, and a second terminal electrically connected to the bulk terminal of the third switch.

According to the second aspect of the present invention, a sense amplifier comprises a first switch having a first terminal receiving a power voltage, a second terminal, and a bulk terminal electrically connected to the first terminal, a second switch having a first terminal electrically connected to the second terminal of the first switch, and a bulk terminal, a third switch having a first terminal electrically connected to the first terminal of the second switch, and a bulk terminal electrically connected to the bulk terminal of the second switch, and a fourth switch having a first terminal electrically connected to the bulk terminal of the first switch and a second terminal electrically connected to the bulk terminal of the third switch.

According to the third aspect of the present invention, a sensing method for a sense amplifier, the sense amplifier comprising two input devices for receiving two input signals, each input device having a bulk terminal, the method includes: floating the bulk terminal of the input devices during a sensing period; and comparing the two input signals.

The present invention can be best understood through the following descriptions with reference to the accompanying drawings, in which:

DETAILED DESCRIPTION OF THE PREFERRED EMBODIMENT

Although the following description contains many specifications for the purposes of illustration, anyone of ordinary skill in the art will appreciate that many variations and alterations to the following details are within the scope of the invention. Accordingly, the following preferred embodiment of the invention is set forth without any loss of generality to and without imposing limitations upon, the claimed invention.

Figure 1:
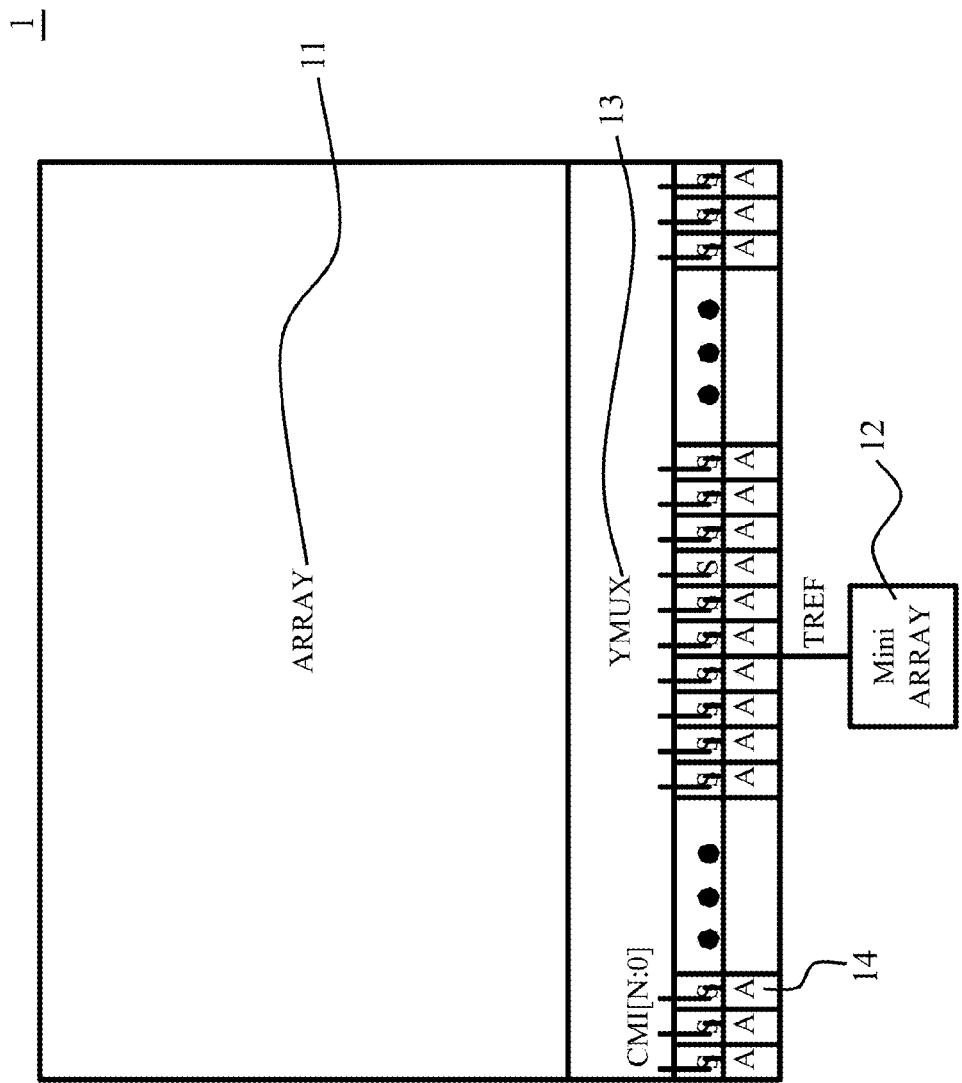
FIG. 1 shows a schematic circuit diagram of a memory system in the related work.

FIG. 1 is a schematic circuit diagram of a memory system in the related work. In FIG. 1, the memory system 1 includes a memory cell array (ARRAY 11) with plural cells (not shown), each of which generates an input signal CMI[N:0], a memory cell mini-array (Mini ARRAY 12) including a reference cell generating a reference voltage TREF and a reference current, a multiplexer (YMUX 13) and a sense amplifier system including plural sense amplifiers 14, wherein the multiplexer has plural input terminals (not shown) electrically connected to plural bitlines (not shown) and plural output terminals (not shown) electrically connected to the plural sense amplifiers to link a specific bitline to a specific sense amplifier.

Figure 2:
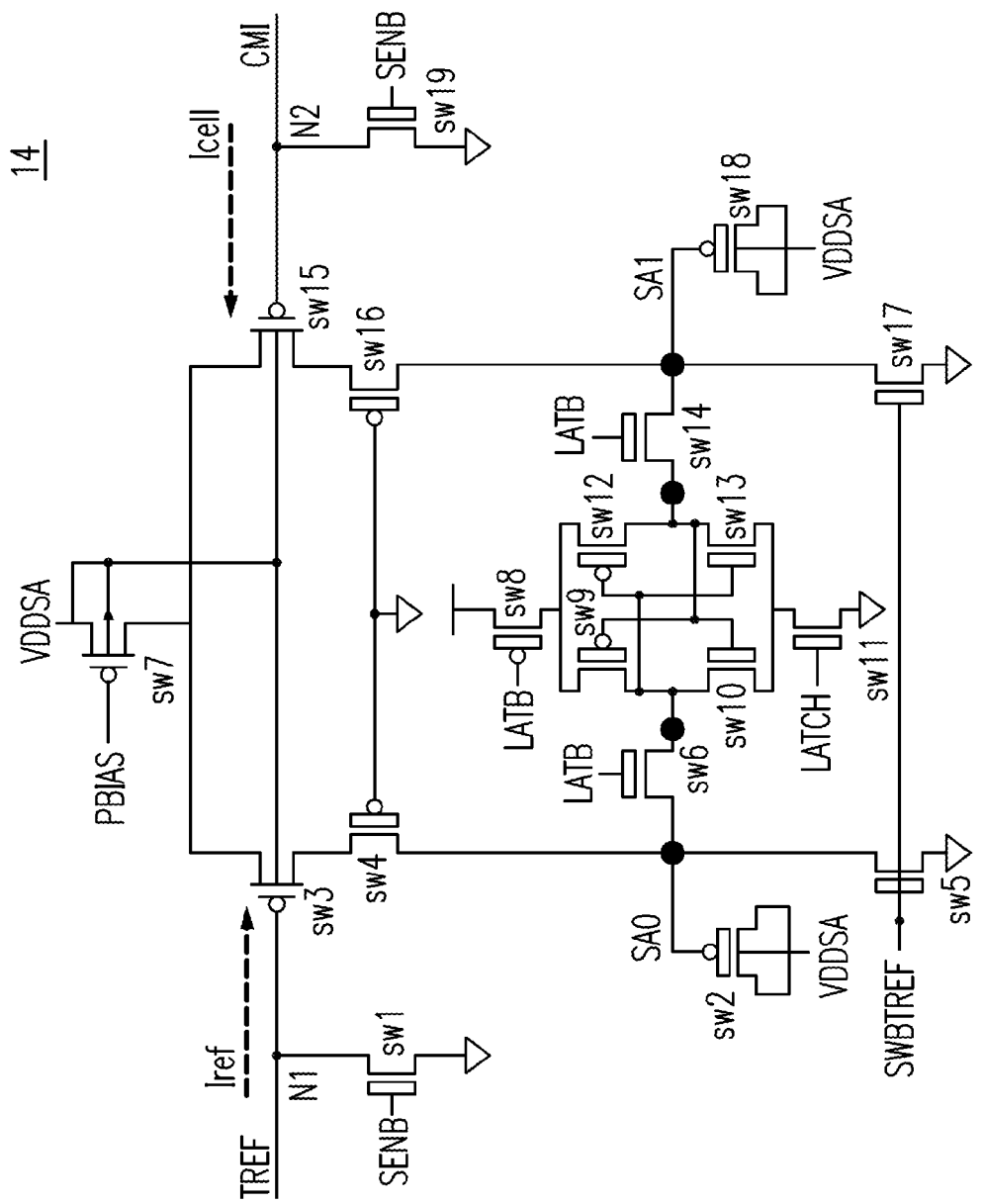
FIG. 2 shows a schematic circuit diagram of a sense amplifier in the related work.

FIG. 2 is a schematic circuit diagram of a sense amplifier in the related work. In FIG. 2, the sense amplifier 14 includes switches sw1 to sw19. As shown in FIG. 2, the first switch sw7 has a first terminal receiving a power voltage VDDSA, a second terminal, a control terminal receiving a bias signal PBIAS and a bulk terminal electrically connected to the first terminal, a second switch sw3 has a first terminal electrically connected to the second terminal of the first switch sw7, a second terminal, a control terminal receiving a reference voltage TREF which causes a first current Iref, and a bulk terminal electrically connected to the bulk terminal of the first switch sw7, and the third switch sw15 has a first terminal electrically connected to the first terminal of the second switch sw3, a second terminal, a control terminal receiving an input signal CMI generated by a cell and inputted from a bitline, which causes a second current Icell, and a bulk terminal electrically connected to the bulk terminal of the second switch sw3.

Referring to FIG. 2, the first current Iref is set up while the fifth switch sw1 (receiving a control signal SENB) is turned on and the fifth switch sw1 is turned off after the first current Iref is set up. The second current Icell is set up while the sixth switch sw19 (receiving a control signal SENB) is turned on and the sixth switch sw19 is turned off after the second current Icell is set up. The node N1 is charged by the first current Iref to have a first potential, the node N2 is charged by the second current Icell to have a second potential, and the first and the second nodes are charged after the first and the second currents are set up. The first node N1 is charged through the first charging route formed by sw3, sw4, and sw5 (receiving a control signal SWBTREF) while sw5 is turned on. The second node N2 is charged through the second charging route formed by sw15, sw16, and sw17 (receiving a control signal SWBTREF) while sw17 is turned on. There is a latch circuit formed by sw6 and sw8-sw14 as shown in FIG. 2, wherein switches sw6, sw8, sw11 and sw14 are enabling switches, sw6, sw8 and sw14 all receive control signal LATB, and sw11 receives control signal LATCH. The latch circuit is coupled to the first and the second charging routes and is enabled to output a binary status of the bitline at the end of a sensing process. There is an eleventh switch sw2 (receiving a power voltage VDDSA) having a control terminal electrically connected to sw6 of the latch circuit, the second terminal of the seventh switch sw4 and the first terminal of the ninth switch sw5, being charged through the control terminal thereof when the latch circuit is enabled, and outputting the binary status being a low level, and a twelfth switch sw18 (receiving a power voltage VDDSA) having a control terminal electrically connected to sw14 of the latch circuit, the second terminal of the eighth switch sw16 and the first terminal of the tenth switch sw17, being charged through the control terminal thereof when the latch circuit is enabled, and outputting the binary status being a high level. The ninth and the tenth switches sw5 and sw17 are turned off when the first and the second potentials are sensed to have a first and a second pre-determined value respectively.

Figure 3:
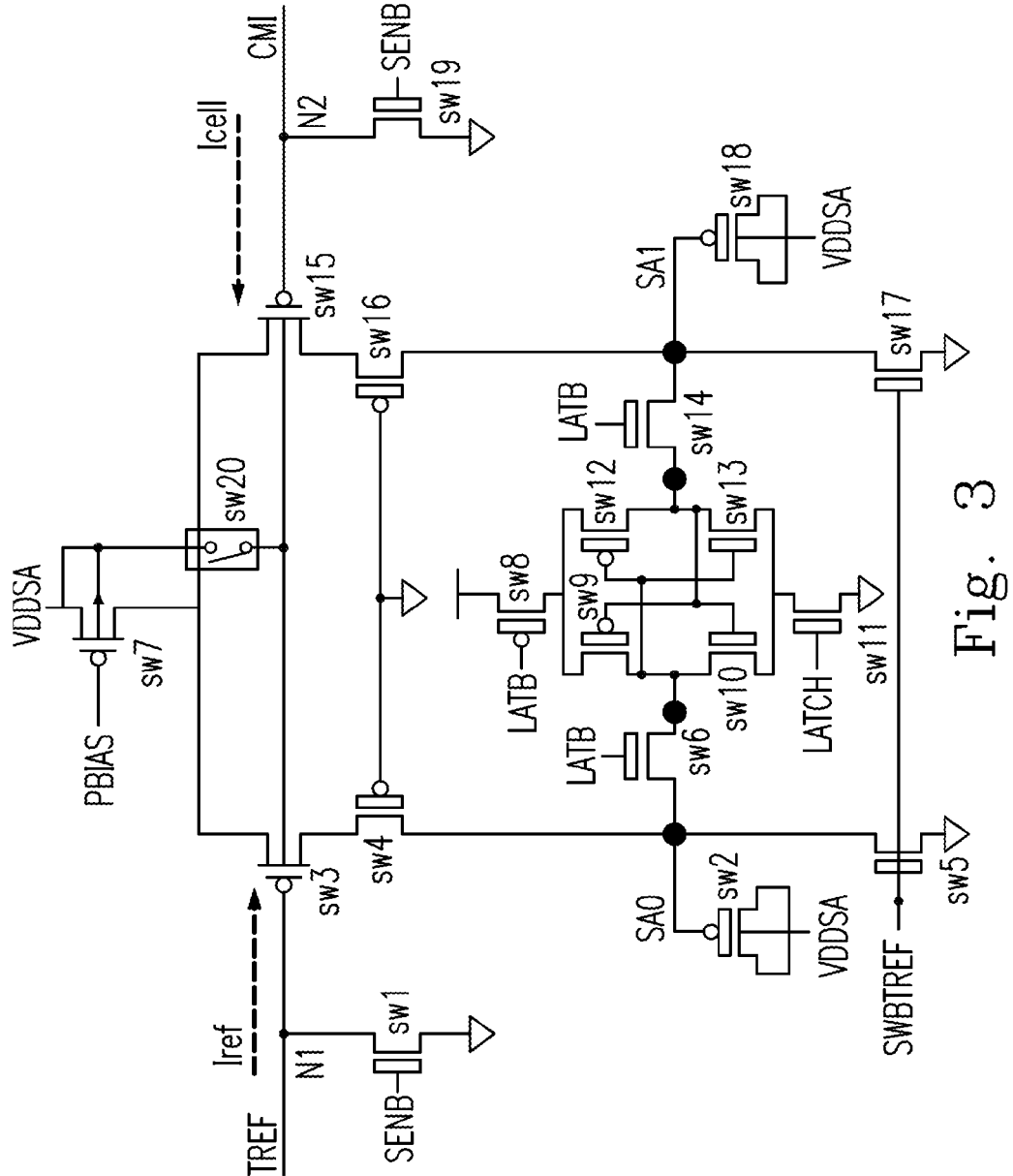
FIG. 3 shows a schematic circuit diagram of a sense amplifier according to the first preferred embodiment of the present invention.

FIG. 3 is a schematic circuit diagram of a sense amplifier according to the first preferred embodiment of the present invention. The difference between the sense amplifier 21 of FIG. 3 and the sense amplifier 14 of FIG. 2 is that a fourth switch sw20 is added, wherein the fourth switch has a first terminal electrically connected to the bulk terminal of the first switch sw7 and a second terminal electrically connected to the bulk terminal of the third switch sw15. The second and the third switches (sw3 and sw15) are configured on a well, the well is electrically connected to the wells of the neighboring sense amplifiers, the fourth switch sw20 is turned off when the first and the second nodes are charged, and the well of a specific sense amplifier is floating when the respective fourth switch sw20 is turned off to decrease a first parasitic capacitance formed between the control terminal and the bulk terminal of the respective second switch sw3 and a second parasitic capacitance formed between the control terminal and the bulk terminal of the respective third switch sw15 so as to decrease a first and a second noises coupled to the first and the second nodes N1 and N2 respectively.

The second and the third switches (sw3 and sw15) of a specific sense amplifier are configured on a respective well, a specific one of the respective wells is electrically connected to at least one of the respective wells of the neighboring sense amplifiers, the fourth switch (sw20) is turned off when the first and the second nodes are charged, and the specific well is floating when the respective fourth switch (sw20) is turned off, wherein the total number of the plural sense amplifiers is, e.g. 1024, then a maximum number of the neighboring sense amplifiers with the connected wells is 1024.

Figure 4:
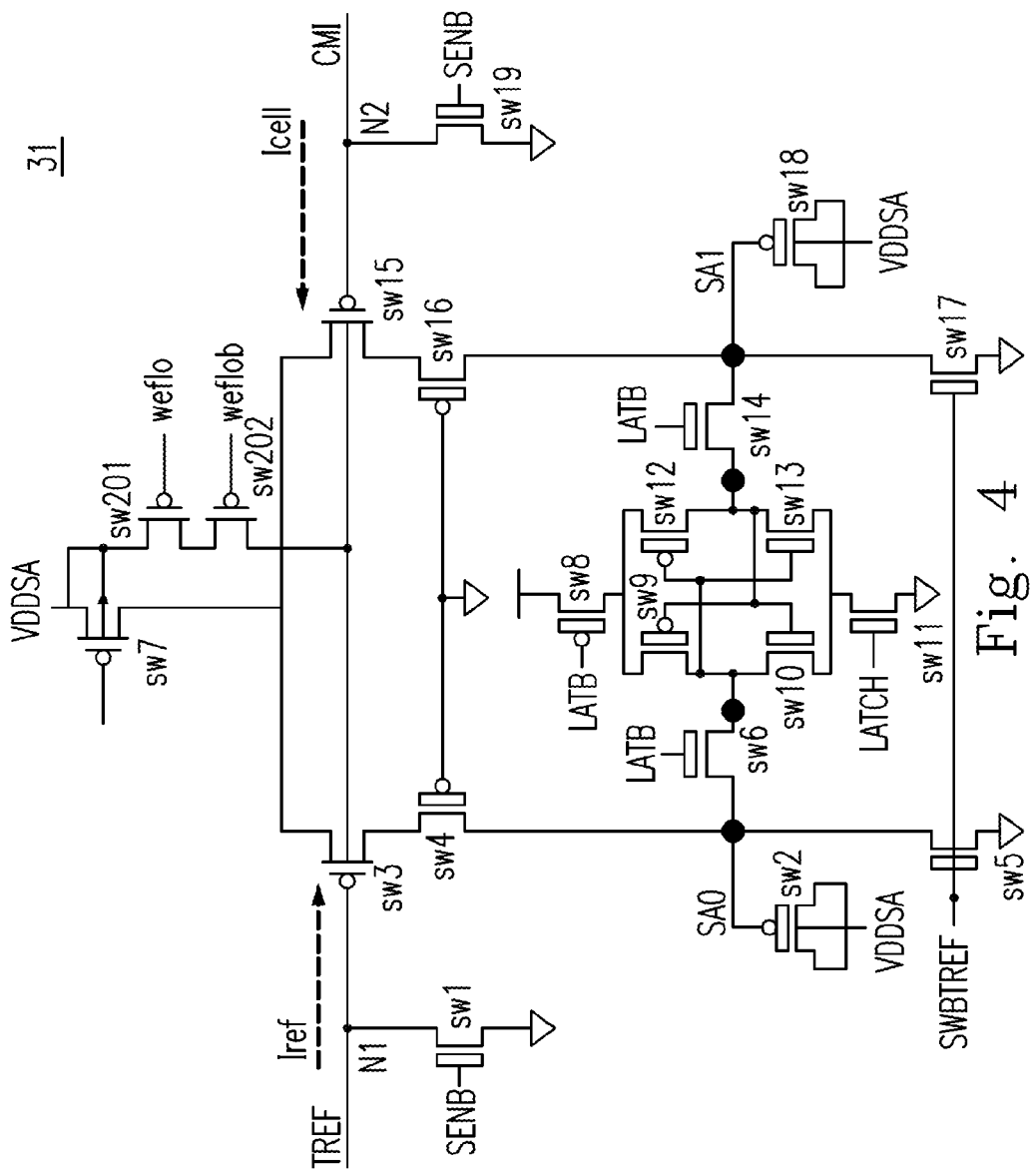
FIG. 4 shows a schematic diagram of a sense amplifier according to the second preferred embodiment of the present invention.

FIG. 4 is a schematic diagram of a sense amplifier according to the second preferred embodiment of the present invention. The difference between the sense amplifier 31 of FIG. 4 and the sense amplifier 21 of FIG. 3 is that the fourth switch sw20 is replaced by a pass gate MOS sw202 receiving a control signal, weflob, and a switch decoupling MOS sw201 receiving a control signal, weflo.

Figure 5:
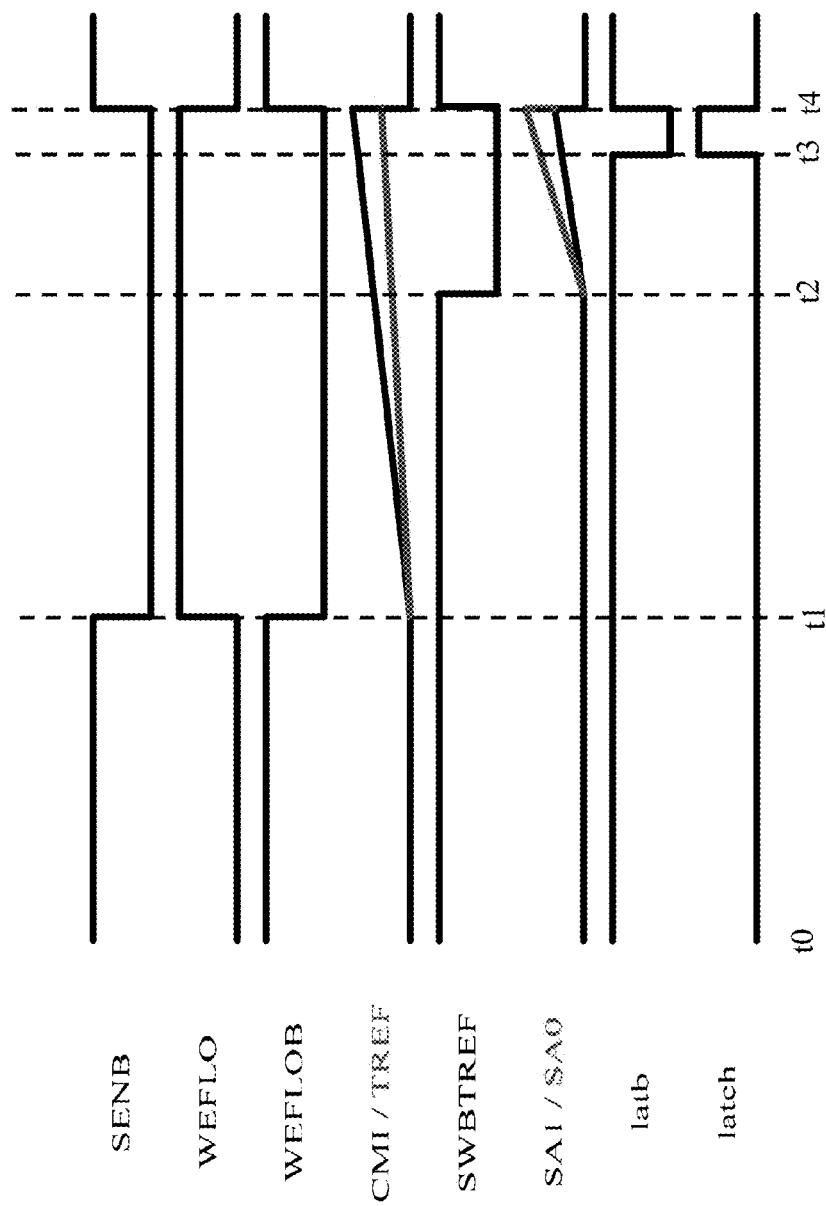
FIG. 5 shows waveform diagrams of control signals of switches in the sense amplifier as shown in FIG. 4.

FIG. 5 is waveform diagrams of control signals of switches in the sense amplifier as shown in FIG. 4. The proposed sensing method for a sense amplifier system, wherein the sense amplifier system comprises plural sense amplifiers (e.g. 14 as shown in FIG. 1), each of which comprises a first switch (e.g. sw7 as shown in FIG. 3) having a first terminal and a bulk terminal electrically connected to the first terminal, a second switch (e.g. sw3 as shown in FIG. 3) having a control terminal receiving a reference voltage (e.g. TREF as shown in FIG. 3) and a bulk terminal, a third switch (e.g. sw15 as shown in FIG. 3) having a control terminal receiving an input signal (e.g. CMI as shown in FIG. 3), and a bulk terminal electrically connected to the bulk terminal of the second switch (sw3), and a fourth switch (e.g. sw20 as shown in FIG. 3) having a first terminal electrically connected to the bulk terminal of the first switch (sw7) and a second terminal electrically connected to the bulk terminal of the third switch (sw15), comprises: charging the second and the third switches (sw3 and sw15) through the control terminals thereof so that the control terminals of the second and the third switches (sw3 and sw15) have a first and a second potentials respectively with respect to a ground and turning off the fourth switch (sw20) when the second and the third switches (sw3 and sw15) are charged through the control terminals thereof; sensing the first and the second potentials when it is within a first pre-determined time period (e.g. t1±1 minute); and comparing the first potential with the second potential so as to generate an output signal (e.g. SA0 or SA1) of a specific sense amplifier. The provided sensing method further comprises a step of setting up a first current (e.g. Iref as shown in FIG. 3) caused by the reference voltage (TREF), and a second current (e.g. Icell as shown in FIG. 3) caused by the input signal (CMI), wherein the first pre-determined time period is at the moment that the charging step begins plus and minus one minute (t1±1 minute), the charging step further comprises steps of: charging the second switch (sw3) through the control terminal thereof by the first current (Icell) and the third switch (sw15) through the control terminal thereof by the second current (Icell); and charging the second and the third switches (sw3 and sw15) through the control terminals thereof after the first and the second currents (Iref and Icell) are set up. Each of the plural sense amplifiers further comprises a fifth and a sixth switches (e.g. sw1 and sw19 as shown in FIG. 3), each of which has a first and a second terminals, the first terminal of the fifth switch (sw1) is electrically connected to the control terminal of the second switch (sw3), the first terminal of the sixth switch (sw19) is electrically connected to the control terminal of the third switch (sw15), the second terminals of the fifth and the sixth switches (sw1 and sw19) are grounded, and the setting up step further comprises steps of: setting up the first and the second currents (Iref and Icell) via the fifth and the sixth switches (sw1 and sw19) respectively; and turning off the fifth and the sixth switches (sw1 and sw19) after the first and the second currents (Iref and Icell) are set up.

Furthermore, the first terminal of the first switch (sw7) receives a power voltage (VDDSA), each of the sense amplifier further comprises a seventh, an eighth, a ninth, and a tenth switches (e.g. sw4, sw16, sw5 and sw17 as shown in FIG. 3), the second switch (sw3), the seventh switch (sw4) and the ninth switch (sw5) form a first charging route for charging the second switch (sw3) through the control terminal thereof, the third switch (sw15), the eighth switch (sw16) and the tenth switch (sw17) form a second charging route for charging the third switch (sw15) through the control terminal thereof, the charging step further comprises a step of turning off the ninth and the tenth switches (sw5 and sw17) when the second and the third switches (sw3 and sw15) are charged through control terminals thereof so that the first potential and the second potential have a first pre-determined value and a second pre-determined value respectively, and the sensing step further comprises a step of sensing the first and the second potentials when it is within a second pre-determined time period being at the moment that the ninth and the tenth switches are turned off plus and minus 1 minute (e.g. t2±1 minute as shown in FIG. 5).

Besides, the memory system 1 as shown in FIG. 1 further comprises a bitline (not shown, connected to the YMUX 13 as shown in FIG. 1) and a cell (included in the ARRAY 11 as shown in FIG. 1), the input signal (CMI) of the sense amplifier system including the plural sense amplifiers 14 is generated by this external cell and inputted via this external bitline, each of the plural sense amplifiers further comprises a latch circuit (sw6 and sw8-sw14 as shown in FIG. 3) coupled to the first and the second charging routes and enabled to output a binary status (SA0 or SA1) of the bitline, an eleventh switch (e.g. sw2, as shown in FIG. 3) having a control terminal electrically connected to the latch circuit (sw6), the second terminal of the seventh switch (sw4) and the first terminal of the ninth switch (sw5), being charged when the latch circuit is enabled, and outputting the binary status being a low level (SA0), and a twelfth switch (e.g. sw18 as shown in FIG. 3) having a control terminal electrically connected to the latch circuit (sw14), the second terminal of the eighth switch (sw16) and the first terminal of the tenth switch (sw17), being charged when the latch circuit is enabled, and outputting the binary status being a high level (SA1), the charging step further comprises a step of charging the eleventh and the twelfth switches (sw2 and sw18) when the latch circuit is enabled, and the sensing step further comprises a step of sensing the first and the second potentials when it is within a third pre-determined time period being at the moment that the latch circuit is enabled plus and minus 1 minute (e.g. t3±1 minute as shown in FIG. 5).

Figure 6:
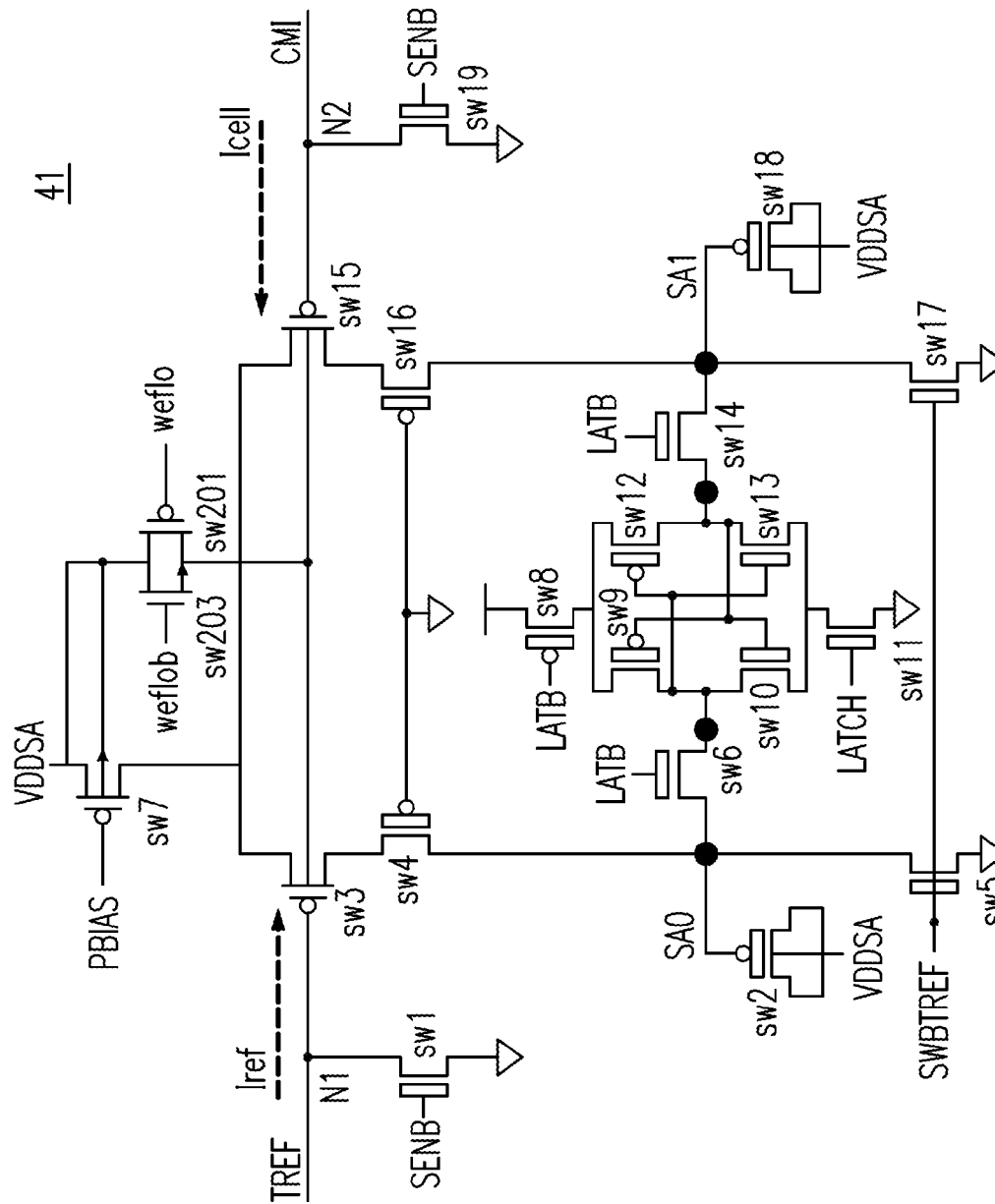
FIG. 6 shows a schematic diagram of a sense amplifier according to the third preferred embodiment of the present invention.

FIG. 6 is a schematic diagram of a sense amplifier according to the third preferred embodiment of the present invention. The difference between the sense amplifier 41 of FIG. 6 and the sense amplifier 21 of FIG. 3 is that the fourth switch sw20 is replaced by a CMOS with a PMOS sw201, receiving a control signal weflo for switch decoupling, and a NMOS sw203, receiving a control signal weflob.

According to the aforementioned descriptions, the present invention provides a sense amplifier system including plural sense amplifiers, each of which receives an input signal generated from a memory cell and inputted from a bitline, and the same reference voltage value, and includes an extra switch floating the well of the input switches during the setting up process of the input signals to decrease the noises coupled to the input switches so as to possess the non-obviousness and the novelty.

While the present invention has been described in terms of what are presently considered to be the most practical and preferred embodiments, it is to be understood that the present invention need not be restricted to the disclosed embodiments. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A sense amplifier system, comprising:
   a sense amplifier including:
      a first switch having a first terminal receiving a power voltage, a second terminal, and a bulk terminal electrically connected to the first terminal;
      a second switch having a first terminal electrically connected to the second terminal of the first switch, and a bulk terminal;
      a third switch having a first terminal electrically connected to the first terminal of the second switch, and a bulk terminal electrically connected to the bulk terminal of the second switch; and
      a fourth switch having a first terminal electrically connected to the bulk terminal of the first switch, and a second terminal electrically connected to the bulk terminal of the third switch.

2. A sense amplifier system according to claim 1, further comprising plural sense amplifiers including the sense amplifier, wherein the first switch further comprises a control terminal, the second switch further comprises a second terminal, and a control terminal receiving a reference current, the third switch further comprises a second terminal, and a control terminal receiving an input signal inputted from an external bitline, each of the plural sense amplifiers includes the first to the fourth switches and a fifth switch having a first terminal electrically connected to the control terminal of the second switch at a first node and a second terminal grounded, the reference current is generated by an external reference cell, and the reference current flows through the second switch to charge the first node.

3. A sense amplifier system according to claim 2, wherein the first current is set up while the fifth switch is turned on, and the fifth switch is turned off after the first current is set up.

4. A sense amplifier system according to claim 3, further comprising a memory cell array having a cell configured therein and generated the input signal, wherein each sense amplifier further comprises a sixth switch having a first terminal electrically connected to the control terminal of the third switch at a second node and a second terminal grounded, and the input signal causes a second current flowing through the third switch to charge the second node.

5. A sense amplifier system according to claim 4, wherein the second current is set up while the sixth switch is turned on, and the sixth switch is turned off after the second current is set up.

6. A sense amplifier system according to claim 5, wherein each sense amplifier further comprises a seventh, an eighth, a ninth and a tenth switches, each of which has a first, a second and a control terminals, the first terminal of the seventh switch is electrically connected to the second terminal of the second switch, the control terminal of the seventh switch is electrically connected to the control terminal of the eighth switch and is grounded, the second terminal of the seventh switch is electrically connected to the first terminal of the ninth switch, the second terminal of the ninth switch is grounded, the first terminal of the eighth switch is electrically connected to the second terminal of the third switch, the second terminal of the eighth switch is electrically connected to the first terminal of the tenth switch, the control terminal of the ninth switch is electrically connected to the control terminal of the tenth switch, the second terminal of the tenth switch is grounded, the second switch, the seventh switch and the ninth switch form a first charging route for charging the first node, and the third switch, the eighth switch and the tenth switch form a second charging route for charging the second node.

7. A sense amplifier system according to claim 6, wherein the ninth switch is turned off when the first node is charged to a first pre-determined value, the tenth switch is turned off when the second node is charged to a second pre-determined value, and a sensing process of the input signal and the reference voltage for determining a binary status of the external bitline begins when the first and the second nodes are charged.

8. A sense amplifier system according to claim 7, wherein the second and the third switches of a specific sense amplifier are configured on a respective well, a specific one of the respective wells is electrically connected to at least one of the respective wells of the neighboring sense amplifiers, the fourth switch is turned off when the first and the second nodes are charged, and the specific well is floating when the respective fourth switch is turned off to decrease a first parasitic capacitance formed between the control terminal and the bulk terminal of the respective second switch and a second parasitic capacitance formed between the control terminal and the bulk terminal of the respective third switch so as to decrease a first and a second noises coupled to the first and the second nodes respectively.

9. A sense amplifier system according to claim 8, wherein the total number of the plural sense amplifiers is $N_1$, and a maximum number of the neighboring sense amplifiers with the connected wells is N2, where $N_2 \leq N_1$, and $N_1$ and N2 are positive integers.

10. A sense amplifier system according to claim 7, wherein each sense amplifier further comprises a latch circuit coupled to the first and the second charging routes and being enabled to output the binary status of the external bitline at the end of the sensing process, an eleventh switch having a control terminal electrically connected to the latch circuit, the second terminal of the seventh switch and the first terminal of the ninth switch, being charged when the latch circuit is enabled, and outputting the binary status being a low level, and a twelfth switch having a control terminal electrically connected to the latch circuit, the second terminal of the eighth switch and the first terminal of the tenth switch, being charged when the latch circuit is enabled, and outputting the binary status being a high level.

11. A sense amplifier system according to claim 2 further comprising a multiplexer having plural input terminals electrically connected to plural external bitlines including the external bitline and plural output terminals electrically connected to the plural sense amplifiers to link a specific external bitline to a specific sense amplifier.

12. A sense amplifier system according to claim 1, wherein the fourth switch is a CMOS with a PMOS for switch decoupling and an NMOS, each of which has a first, a second and a control terminals, and the two first terminals and the two second terminals of the PMOS and the NMOS are electrically connected.

13. A sense amplifier system according to claim 1, wherein the fourth switch includes a pass gate MOS and a switch decoupling MOS, each of which has a first, a second and a control terminals, the first terminal of the switch decoupling MOS is electrically connected to the first terminal of the first switch, the second terminal of the switch decoupling MOS is electrically connected to the first terminal of the pass gate MOS, and the second terminal of the pass gate MOS is electrically connected to the first terminal of the pass gate MOS and the bulk terminal of the third switch.

14. A sense amplifier, comprising:
a first switch having a first terminal receiving a power voltage, a second terminal, and a bulk terminal electrically connected to the first terminal;
a second switch having a first terminal electrically connected to the second terminal of the first switch, and a bulk terminal;
a third switch having a first terminal electrically connected to the first terminal of the second switch, and a bulk terminal electrically connected to the bulk terminal of the second switch; and
a fourth switch having a first terminal electrically connected to the bulk terminal of the first switch and a second terminal electrically connected to the bulk terminal of the third switch.

15. A sense amplifier according to claim 14, wherein the first switch further comprises a control terminal receiving a bias signal, the second switch further comprises a second terminal and a control terminal receiving a reference voltage, the third switch further comprises a second terminal and a control terminal receiving an input signal to be compared with the reference voltage so as to generate an output signal, the input signal is generated by an external cell and inputted from an external bitline, the output signal is used to determine a binary status of the bitline, and the binary status is one of a high level and a low level.

16. A sensing method for a sense amplifier, the sense amplifier comprising two input devices for receiving two input signals, each input device having a bulk terminal, wherein the sense amplifier further comprises a first to a fourth switches, the second and the third switches are respectively the two input devices, each of the first to the third switches has a first, a second, a control and a bulk terminals, the fourth switch has a first, a second and a control terminals, the second terminal of the first switch is electrically connected to the first terminals of the second and the third switches, the bulk terminal of the first switch is electrically connected to the first terminal thereof, the control terminals of the second and the third switches respectively receive a reference and an input voltages being the two input signals, the bulk terminals of the second and the third switches are directly electrically connected to each other, the first terminal of the fourth switch is electrically connected to the bulk terminal of the first switch, and the second terminal of the fourth switch is electrically connected to the bulk terminal of the third switch, the method comprising:
turning off the fourth switch when the second and the third switches are charged through the control terminals thereof such that the bulk terminals of the second and the third switches are floating during a sensing period; and
comparing the reference voltage and the input voltage.

17. A sensing method for a sense amplifier system according to claim 16, further comprising:
charging the second and the third switches through the control terminals thereof so that the control terminals of the second and the third switches have a first and a second potentials respectively with respect to a ground, wherein the sensing period is in a range of the moment that the charging step begins plus and minus one minute.

* * * * *